United States Patent [19]

Bergman, Jr. et al.

[11] 4,165,515

[45] Aug. 21, 1979

[54] LIGHT EMITTING TUNNEL JUNCTIONS WHICH ARE STABLE AT ROOM TEMPERATURE

[75] Inventors: John G. Bergman, Jr., Rumson, N.J.; Ravinder K. Jain, Pacific Palisades, Calif.; Sigurd Wagner, Holmdel, N.J.

[73] Assignee: Bell Telephone Laboratories, Incorporated, Murray Hill, N.J.

[21] Appl. No.: 865,238

[22] Filed: Dec. 28, 1977

[51] Int. Cl.² ............................................. H01L 49/02
[52] U.S. Cl. .......................................... 357/6; 357/17; 357/4
[58] Field of Search ........................... 357/6, 4, 30, 17

[56] References Cited

U.S. PATENT DOCUMENTS 3,781,549  12/1973  Fletcher et al. ................... 250/211 J

OTHER PUBLICATIONS

DeLord, et al., Appl. Phys. Lett., vol. 11, No. 9, Nov. 1, 1967, pp. 287 et seq.
McCarthy et al., Appl. Phys. Lett., vol. 30, No. 8, Apr. 15, 1977, pp. 427 et seq.

*Primary Examiner*—Martin H. Edlow
*Attorney, Agent, or Firm*—Bruce S. Schneider

[57] ABSTRACT

Devices which emit in the visible region having a metal oxide barrier layer, e.g. magnesium oxide or beryllium oxide, and having a corresponding metal electrode, i.e., a magnesium or beryllium electrode, in addition to a silver electrode are stable at room temperature. The emitted light spectrum is dependent on the voltage applied to the device which emits an orange or green appearing light for the Mg and Be junctions, respectively.

7 Claims, 3 Drawing Figures

LIGHT EMITTING TUNNEL JUNCTIONS WHICH ARE STABLE AT ROOM TEMPERATURE

BACKGROUND OF THE INVENTION

1. Field of the Invention

This invention relates to junction devices and, more particularly, to metal oxide junction devices.

2. Art Background

Flat large area display devices are a desirable goal for many applications, such as large area television screens. As a first step in achieving this goal, it is necessary to produce a thin film device which can function as an element of a large array. To be suitable for most commercial applications these device elements should have certain general properties. First, because many elements are necessary to form an array, they should be relatively inexpensive. Further, these devices should operate on voltages typically used with integrated circuitry and should have a long lifetime at room temperature.

Various flat luminescent display devices have been demonstrated, but none, as yet, entirely satisfy these criteria. For example, plasma or electroluminescent panels have been made. The former type panels consist of a small quantity of gas encapsulated between transparent plates. A discharge is initiated in the gas which then emits visible light. Such panels require a high voltage, typically 150 volts, to produce the discharge. The latter type panels operate by applying an a.c. or d.c. voltage to a layer of semiconductor material such as ZnS. Again, a high voltage (typically several hundred volts) is necessary to produce light emission. Therefore, these devices are not usable in conjunction with integrated circuitry.

A second type display device, which is presently widely used, is light emitting diodes. These diodes utilize low voltages, typically 2 volts, and are stable at room temperature. However, the semiconductor materials usually used in these diodes and the cost of the processing necessary to form the diodes from the semiconductor materials makes them relatively expensive devices. Although this expense is not significant for uses that require a small number of characters such as in digital watches, applications which require a large array of such devices are often economically precluded.

Another recently reported display device (See McCarthy and Lambe, Appl. Phys. Lett., 30, 427 (1977)) is a tunnel junction composed of an aluminum oxide layer between an aluminum and silver electrode. This device operates at low voltages, e.g., 2 to 5 volts as do light emitting diodes. Unlike light emitting diodes, this device utilizes inexpensive materials and is formed by relatively economical processing steps. Unfortunately, for typically applied voltages this device based on an aluminum oxide barrier is only stable at low temperatures, e.g., liquid nitrogen temperatures. Attempts to operate this device at room temperature produce an instantaneous destruction of the device. For these reasons, none of these currently available devices possess all the previously enumerated attributes.

SUMMARY OF THE INVENTION

Devices using a magnesium oxide or beryllium oxide layer with a corresponding metal electrode, i.e., magnesium or beryllium and an additional electrode of silver have been made. These devices are made by commercially acceptable processes such as evaporation and plasma oxidation. Low operating voltages, typically below 8 volts, produce visible light in the orange or green region of the spectrum for the Mg and Be devices, respectively. Additionally, these devices are stable at room temperature. For example, no noticeable change in electrical or optical properties has been observed in the magnesium oxide device for operating times up to about 30 hrs. For the beryllium device, which has undergone less testing, stable operation for up to 10 minutes is observed. Longer operating times are undoubtedly possible, but, as yet, have not been attempted.

DETAILED DESCRIPTION

It is contemplated that the inventive devices operate through a tunneling mechanism. That is, a voltage is applied across the electrodes inducing electrons to tunnel from the metal electrode through the metal oxide which acts as a barrier layer, to the silver electrode or vice versa. These electrons induce formation of surface plasmon modes in the metal-metal oxide-silver structure which decay radiatively to emit light. This radiative decay is induced by the rough surface of the silver which functions, although inefficiently, as a grating to emit light. The remainder of the application expresses parameters necessary for constructing the device in terms of this probable explanation. However, the parameters denominated are those found useful and do not depend on any specific mechanism of operation. The theoretical mechanism is merely used as a pedagogic tool.

Figure 1:
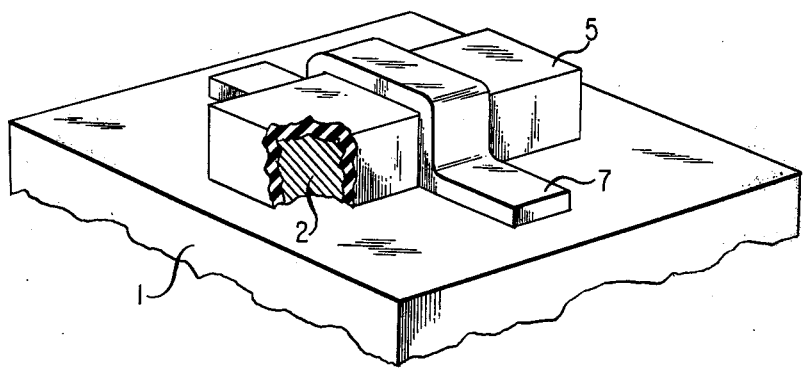
FIG. 1 is a schematic representation of an embodiment of the invention.

Since the inventive devices are made essentially of thin film layers, it is necessary to build them upon a supporting substrate. The particular substrate (denominated 1 in FIG. 1) used is not critical. However, it is more convenient for fabricating the device if the substrate is a nonconducting material. In this way, discontinuities in the base electrode, i.e., the electrode deposited directly on the substrate, are tolerable without producing a short circuit when subsequent layers are formed. It is also convenient to use a flat uniform substrate. The use of such a substrate helps insure reproducibility in device fabrication. Generally glass or ceramic substrates with smooth surfaces are useful and are employed in the manufacture of the inventive devices.

For ease of fabrication, it is convenient to build a device by first depositing the magnesium or beryllium electrode, i.e., the metal electrode, 2, on the substrate. In this manner, the exposed metal electrode surface is oxidized to form either the magnesium oxide or beryllium oxide layer, 5, and the silver electrode, 7, is deposited directly on this oxide layer. Although other methods of fabrication are possible, this fabrication sequence appears to be the simplest.

It is necessary to have a rough silver electrode layer for emission of light with a practical intensity. Various means exist to produce this roughness. For example, the silver electrode is etched with an acid etchant, e.g., HCl vapor, to produce the necessary roughness. (See Lambe and McCarthy, Phys. Rev. Letts., 37, 923 (1976).) However, it has been found more convenient to introduce the roughness through deposition on an underlying rough surface. Since the entire device in the preferred embodiment is built on the metal electrode layer, 2, the subsequently deposited layers form essentially the same surface configuration as this first deposited layer. Therefore, a rough silver layer requires deposition on a rough metal electrode layer. Roughness is a function of both the crystallite size and the spacing between these crystallites. Generally, crystallites between $0.01\mu$ and $5\mu$, preferably between 0.01 and $1\mu$, and spaces in the same ranges provide the necessary roughness in the metal electrode layer which, in turn, produce rough, silver layers. The values given for spacing and crystallite size are average values. Any layer will have a distribution of spaces and crystallite sizes. Distributions ranging up to $5\mu$ are acceptable. The intensity of the emitted light diminishes as the surface becomes smooth. Roughnesses outside the given ranges are generally unacceptable for practical applications.

The size of the crystallites obtained is dependent on the thickness of the deposited layer. Since, by design, these layers are made rough, there is no single thickness which describes the entire layer. However, a useful measure of the thickness is the step height, i.e., the average thickness measured at the end of the film by an instrument such as an interferometer. Generally, a layer with an average thickness of $\frac{1}{2}\mu$ produces crystallites of $\frac{1}{2}\mu$ average size with appropriate spacing between crystallites. Thinner layers are necessary to produce smaller crystallites.

Various methods are useful for depositing a rough metal electrode layer. For example, the magnesium layer is deposited on a rough substrate. However, since it is more desirable to employ smooth substrates, it is convenient to use a simple evaporation process. To deposit the metal electrode layer, a resistively heated boat is filled with elemental magnesium or beryllium. The substrate is positioned above the boat. The temperature of the boat is then slowly increased until deposition of magnesium or beryllium on the substrate is indicated by a quartz crystal monitor. The temperature is then maintained at this value until the desired thickness is obtained. Generally, this method of deposition, if done in an apparatus evacuated to a pressure below $10^{-3}$ Torr provides adequately rough magnesium surfaces.

After the metal electrode layer is deposited, a layer of oxide is produced by oxidizing the exposed surface of the metal. The thickness of the barrier layer should permit tunneling of a significant number of electrons for the low applied voltages. Typically thicknesses in the range of 10 to 130 Å are acceptable. This value for the thickness is again an average value. An appropriate layer thickness is obtained if a plasma oxidation process is used. In this method, the substrate with its deposited magnesium or beryllium layer is placed in an oxygen atmosphere and a discharge is struck. Under these conditions, the exposed metal oxide layer begins to oxidize. The oxidation process is self-terminating. The exact reason for this termination is uncertain. However, a contemplated explanation is that the oxidation depends on tunneling of electrons through the outside oxide layer to oxygen atoms adsorbed on the surface. The oxygen atoms are ionized by these electrons and diffuse through the oxide layer to the unoxidized portion of the magnesium or beryllium. The continued oxidation ends when the electrons no longer can tunnel or the ions no longer can diffuse through the thickness of the metal oxide layer resulting in the termination of the oxide formation process. By use of plasma oxidation, metal oxide films of appropriate thicknesses are produced. The method of forming this oxide layer is not critical. (Indeed, by the plasma oxidation method itself, thinner barrier layers within the useful range are obtained by ending the oxidation process before self-termination.) However, use of plasma oxidation produces uniform oxide films without processing problems or thickness control problems.

After formation of the metal oxide barrier layer, the final silver electrode is deposited. The thickness of the silver electrode should generally be less than 500 A. Thicker layers are usually not acceptable since the light intensity is unacceptably low for practical applications. The lower limit on the thickness of the silver electrode is determined by the current carried by the device. Generally, for thicknesses of continuous films producible by standard techniques, the silver electrode should be capable of carrying approximately $10^6$ A/cm$^2$. The cross-sectional area used in denoting this current carrying capability is again an average value. It is the average thickness of the silver electrode, as measured by an instrument such as an oscillating quartz crystal deposition monitor, times the width of the electrode at the point it first overlaps with the underlying metal oxide barrier layer.

The current drawn by the device depends on the bias voltage. The bias voltage must be sufficiently high to produce light emission and yet low enough to prevent breakdown of the barrier layer. For present magnesium devices having about a 100 Å barrier layer voltages typically between 2 volts and 3 volts, preferably 2.1 to 2.75 are used. Voltages above 2.75 shorten the lifetime of the device. Voltages below 2 volts yield insufficient intensity. The short wavelength edge of the light emitted depends on the voltage applied. For example, voltages ranging from 2 to 3 produce short wavelength edges ranging from 620 nm to 413 nm. Thus, the voltage applied is set in accordance with the short wavelength edge desired. For beryllium devices having barrier layers of about 120 Å, voltages between 5 and 10 volts are used. For this voltage range a green light is observed. In either device the voltages used change to a certain extent with the barrier thickness. For voltages in the general range given, currents of about 1 ampere per cm$^2$ of junction area are obtained. Exemplary of silver electrode thicknesses used is about 300 Å for electrode widths of between 0.2 and 0.5 cm.

EXAMPLE 1

A 0.1 cm thick piece of a smooth glass slide (American Saint Gobain TF 26) measuring $\frac{1}{4}$ by $\frac{1}{4}$ in. was cleaned by successively immersing in trichlorethylene and methanol. The substrate was then dried in dust free air. A mask made from Be/Cu alloy measuring $\frac{1}{4}$ by $\frac{1}{4}$ in., having a thickness 0.01 cm, and having a cutout portion measuring 1 cm by 0.25 cm, was placed over the substrate. The two were then inserted in an evaporation apparatus so that the mask side of the substrate, faced, and was suspended above, a tantalum mesh boat. Magnesium having a purity of 99.999% was placed in the boat and the apparatus was evacuated to approximately $10^{-5}$ Torr using an oil diffusion pump. The tantalum boat was then resistively heated and the temperature was increased until deposition was seen on a quartz crystal monitor. The temperature of the boat was then stabilized and the deposition was continued until approximately 5000 Å as measured on a quartz crystal monitor was obtained. Once the deposition temperature was achieved, it took approximately 3 min. to obtain this thickness. The boat was cooled and in the same evaporation apparatus an atmosphere of approximately 50μ of pure oxygen was introduced. A discharge in the gas was struck using a d.c. potential of between about 800 and 1000 volts. The voltage and oxygen pressure were continually adjusted to maintain a uniform steel gray appearance of the discharge. The discharge was continued for approximately 15 min. The apparatus was then vented and the mask and underlying substrate was removed. The mask was then rotated 90 degrees so that the cutout part was perpendicular to the previously deposited strip of magnesium. The mask and underlying substrate was then inserted into another evaporation apparatus with the masked side of the substrate suspended above and facing a boat made of sheet tantalum. The boat was filled with elemental silver having a purity of 99.999% and the apparatus evacuated to a pressure of approximately $10^{-6}$ Torr using an oil diffusion pump. The temperature of the tantalum boat was increased by resistive heating until deposition on the substrate was observed on a quartz crystal monitor. The temperature was then maintained and the evaporation was continued until approximately 300 Å of silver was deposited. Typically this deposition took approximately 20 seconds. The apparatus was then vented and the substrate with its deposited layers was removed.

Figure 2:
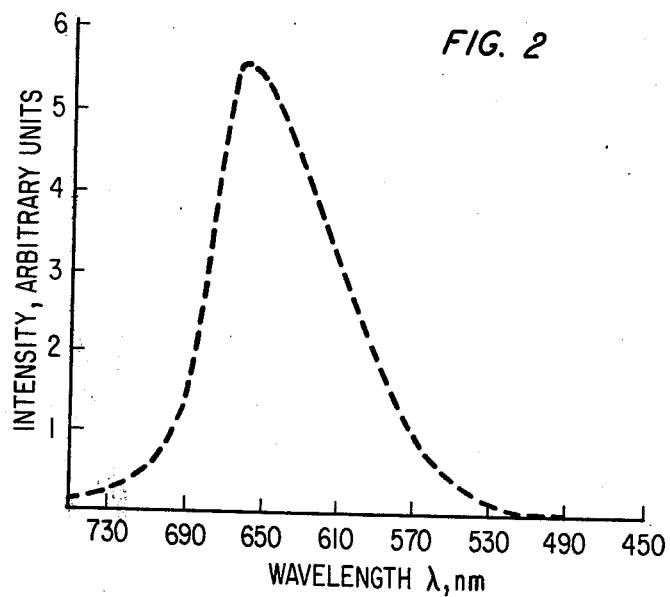
FIGS. 2 and 3 indicate properties of one embodiment of the invention.
Figure 3:
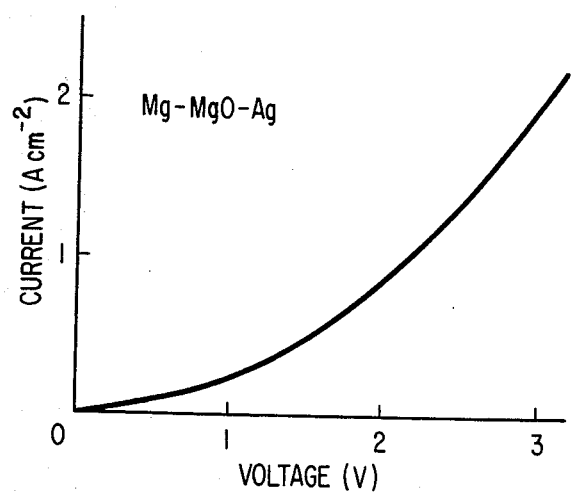

Pressure contacts were made to the magnesium and to the silver electrodes and a potential of 2.55 volts was applied across these electrodes by starting at zero bias and raising the voltage at a rate of 1 V/min. until the 2.55 value was obtained. The room temperature spectrum and I-V characteristics are shown in FIGS. 2 and 3, respectively.

EXAMPLE 2

The same procedure as described in Example 1 was followed except 99.5% pure Be was evaporated on the substrate to form about a 700 Å thick layer. A potential of 8 volts was again slowly applied and produced a green appearing light.

What is claimed is:

1. A metal oxide device comprising a metal oxide layer in intimate contact with both a first electrode consisting essentially of said metal and a second electrode consisting essentially of silver, CHARACTERIZED IN THAT said metal is chosen from the group consisting of beryllium and magnesium, whereby when a voltage is applied across said first and second electrode at room temperature a continuous visible light emission is obtainable whereby when a voltage is applied across said first and second electrode at room temperature a continuous visible light emission is obtainable.

2. The device of claim 1 wherein said metal oxide layer is formed by plasma oxidation of said second electrode.

3. The device of claim 2 wherein said plasma oxidation is done in a discharge.

4. The device of claim 1 including a substrate.

5. The device of claim 4 wherein said substrate is glass.

6. A device fabricated by successive formation of a metal layer, an oxide layer of said metal and a silver layer wherein said metal is chosen from the group consisting of beryllium and magnesium.

7. The device of claim 1 including electrical contacts to said first electrode and said second electrode whereby when a voltage is applied to said electrodes visible light is produced.

* * * * *

UNITED STATES PATENT AND TRADEMARK OFFICE
CERTIFICATE OF CORRECTION

PATENT NO. : 4,165,515

DATED : August 21, 1979

INVENTOR(S) : John G. Bergman, Jr., Ravinder K. Jain, and Sigurd Wagner

It is certified that error appears in the above-identified patent and that said Letters Patent are hereby corrected as shown below:

Column 6, line 32, after "magnesium" delete the period and add --, whereby when a voltage is applied across said first and second electrode at room temperature a continuous visible light emission is obtainable.--.

Signed and Sealed this

Eighth Day of April 1980

[SEAL]

Attest:

SIDNEY A. DIAMOND

Attesting Officer

Commissioner of Patents and Trademarks